US005925966A

United States Patent [19]

Riftin et al.

[11] Patent Number: 5,925,966

[45] Date of Patent: Jul. 20, 1999

[54] METHOD FOR PROTECTING ULTRASONIC TRANSDUCERS FROM DETERIORATION

[75] Inventors: Alex Riftin, Ashdod; Yacov Shoham; Zeev Rosner, both of Kibbutz Netzer Sereni; Eli Gorenstein, Savyon, all of Israel

[73] Assignee: Green Clouds Ltd., Savyon, Israel

[21] Appl. No.: 08/907,460

[22] Filed: Aug. 8, 1997

[51] Int. Cl.[6] .................... H01L 41/08

[52] U.S. Cl. .................... 310/311; 310/316; 310/317; 310/334

[58] Field of Search .................... 310/311, 316, 310/317, 319, 334, 335, 337

[56] References Cited

U.S. PATENT DOCUMENTS

| | | | |
|---|---|---|---|
| 3,315,102 | 4/1967 | Quint et al. | 310/317 X |
| 3,318,578 | 5/1967 | Branson | 310/316 X |
| 3,500,089 | 3/1970 | Brech et al. | 310/316 |
| 3,516,645 | 6/1970 | Arndt | 310/316 X |
| 5,140,493 | 8/1992 | Janicek | 310/317 X |
| 5,625,249 | 4/1997 | Grant | 310/334 |
| 5,834,871 | 11/1998 | Puskas | 310/325 X |

*Primary Examiner*—Mark O. Budd
*Attorney, Agent, or Firm*—Lowe Hauptman Gopstein Gilman & Berner

[57] ABSTRACT

A method for protecting ultrasonic transducers from deterioration for use in devices having multiple transducers immersed in a liquid reservoir comprises the steps of placing each transducer within an isolation territory within the reservoir such that the territory is topologically bounded by at least one conductive member with the transducer and conductive member having no electrical contact. The potential between the conductive members is balanced by electrically interconnecting the members. The vibrating surface of each transducer and the centroid of each associated isolation territory are oriented approximately coaxially.

4 Claims, 2 Drawing Sheets

METHOD FOR PROTECTING ULTRASONIC TRANSDUCERS FROM DETERIORATION

FIELD OF THE INVENTION

The present invention generally relates to a method for protecting ultrasonic transducers from deterioration, in devices having multiple transducers which are immersed in a common liquid reservoir. More specifically the present invention relates to a method which is comprised of placing each transducer within an isolation territory (topologically bounded by at least one conductive member, such that the transducer and its associated member have no direct electrical contact), and interconnecting (or grounding) the members (wherein the vibrating surface of each transducer and the centroid of each associated territory are oriented approximately coaxially).

BACKGROUND OF THE INVENTION

During the use of multiple ultrasonic transducers in a common liquid, there occurs the undesirable phenomenon of accelerated deterioration of the transducers. A "common liquid" in the context of the present invention relates to, either a single liquid containing cell, or a plurality of cells having interconnecting passages between them for the liquid.

All of these undesirable phenomenon begin immediately (when the transducer are activated) and progress at different rates. The reasons for this accelerated deterioration are as follows:

Firstly, electrical cross talk and interference between the transducers creates local electrolysis on some of the transducers which results in their deterioration and destruction. This selective destruction of some of the transducers occurs on the order of seconds after the transducers are activated for ultrasonic wave production.

Secondly, cavitation causing free ions migrate in the liquid and neutralize their charges by perforating the surfaces (or the surface coating) of other (remaining operational) transducers. This selective perforation process (destroying additional operating transducers) occurs on the order of hours after the transducers are activated.

Thirdly, there is a still slower transducer destroying process caused by incomplete electrical balancing between the transducers, secondary coils of the power transformer(s), and ground (when the liquid is grounded).

The method according to the present invention solves these problems by the adding of sacrificial components. The transducer destructive processes are thus replaced with processes destructive to these sacrificial components. These sacrificial components in turn may have operational lifetimes thousands of hours—essentially according to the mass of the sacrificial components.

SUMMARY OF THE INVENTION

The present invention relates to a method for protecting ultrasonic transducers from deterioration. The present method is for use in devices having multiple transducers which are immersed in a common liquid reservoir. The method according to the present invention is comprised of: (a) placing each transducer within an isolation territory within the reservoir (and each such territory is topologically bounded by at least one conductive member such that the transducer and its associated member have no direct electrical contact), and (b) interconnecting the members; wherein the vibrating surface of each transducer and the centroid of each associated territory are oriented approximately coaxially.

DETAILED DESCRIPTION OF THE INVENTION

For purposes of the present invention "members" relate to plates, nets, rings, wires, pins, or any combination thereof. A "conductive" member is electrically conductive, hence normally made from metal. A "ring" in general relates to a hollow metallic tube, or to a flat metallic layer having an opening (circular or otherwise).

The present invention relates to a method for protecting ultrasonic transducers from deterioration. The present method is for use in devices having multiple transducers which are immersed in a common liquid reservoir. The method according to the present invention is comprised of: (a) placing each transducer within an isolation territory within the reservoir (and each such territory is topologically bounded by at least one conductive member such that the transducer and its associated member have no direct electrical contact), and (b) ballancing the potential between the members by interconnecting the members; wherein the vibrating surface of each transducer and the centroid of its associated territory are oriented approximately coaxially.

By placing each transducer within an isolation territory comprised of one or more conductive members and by interconnecting the members, electrical cross talk and interference between the transducers must traverse the intervening members. Thus all local electrolysis effects created by the cross talk and interference (between transducers) results firstly in the destruction of the members. This sacrificial use of the members can extend transducer life span in a multiple transducer environment to life spans of transducers found in single transducer environments.

Most cavitation causing free ions migrate in the liquid and neutralize their charges, and by that perforate the surfaces of these sacrificial members. The slower transducer destroying process caused by incomplete electrical balancing between the transducers is likewise advantageously mitigated by the grounding of each member.

The vibrating surface of the transducer has an axis along which the ultrasonic waves propagate. The transducer's associated isolation territory has an axis which is the centroid of the territory as defined by one or more contributing conductive members.

According to the method of the present invention the orientation of the axis of the transducer with respect to the axis of the associated isolation territory is approximately coaxial (parallel), for preventing ultrasonic wave distortions caused by the material and curvature of the members (and such distortions reduce the effective transducer efficiency). For example, if the member is a hollow tube and the isolation territory is the cylindrical space therein, then the transducer's vibrating surface (located within the tube) is oriented approximately in the same direction as the axis of the cylinder.

According to the preferred embodiment of the present method, the potential between the members is balanced by grounding each member. This further reduces the transducer destructive effects.

Furthermore according to the preferred embodiment of the present method, indirect electrical contact between the transducers and the members is provided by grounding the core of the secondary coils of the power transformer of the transducers, such that the potential between said coils is equalized. This is especially effective for further diminishing transducer destructive effects where the common liquid is grounded (e.g. water connected to a water pipe network).

For the purposes of the present invention "topologically bounded" relates the effective limiting of the path of cavitation ions in a liquid. This limiting may be by a closed circumscribing barrier, by a labyrinth-like arrangement of barriers, by an ion filtering barrier (or barriers), or by limiting the possible paths to regions where the charge difference between the cavitation ions and the barrier will effectively bring the two into contact—even though there are paths for uncharged particles which are not so limited.

The present invention will be further described by FIGS. 1 through 3. These figures are solely intended to illustrate the preferred embodiment of the invention and are not intended to limit the scope of the invention in any manner.

Figure 1:
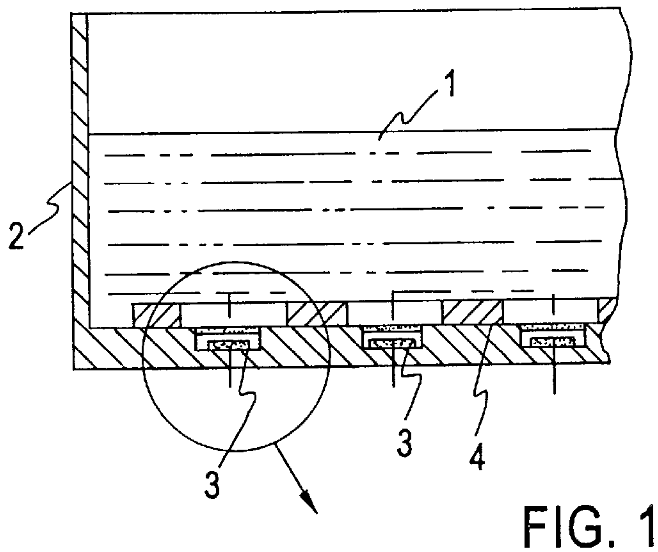
FIG. 1 illustrates a profile cross section of a device having multiple liquid immersed transducers.

FIG. 1 illustrates a profile cross section of a device having multiple liquid immersed transducers. A common liquid (1) filled tank (2) is shown having ultrasonic transducers (3) immersed in the liquid. Each transducer has been placed within a conductive ring (4) such that the transducer and the ring have no direct electrical contact These ring-like openings are formed in a common conductive (metallic) layer (plate). The vibrating surface (see item 5 in FIG. 2) of each transducer and its associated ring shaped member are oriented approximately coaxially.

Each ring has been grounded, and the potential between the rings is further balanced by electrically interconnecting the rings.

Figure 2:
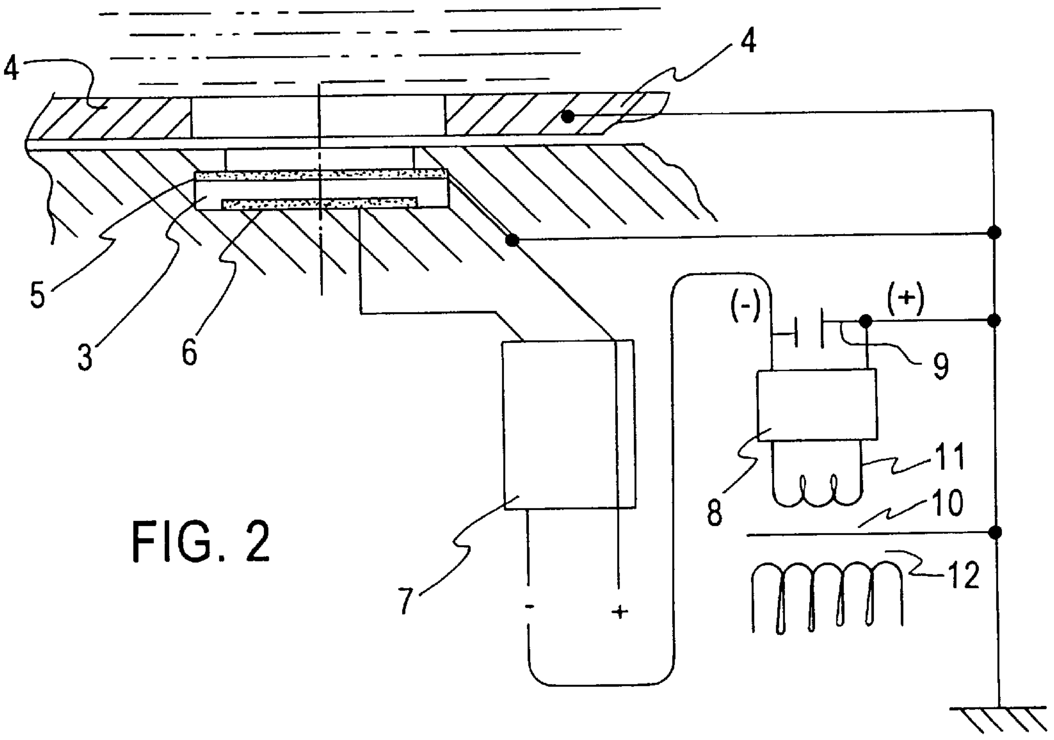
FIG. 2 illustrates a schematic diagram of transducer protecting electric circuitry.

FIG. 2 illustrates a schematic diagram of transducer protecting electric circuitry. An ultrasonic transducer (3) having a vibrating surface (5) and a cold surface (6) are shown connected to a wave form generator (7) having a DC blocking capacitor (not shown).

The vibrating surface of the transducer is both connected to one side of the wave form generator (plus) and grounded. The cold surface of the transducer is connected to the other side of the wave form generator (minus). The minus side of the wave form generator is furthermore both connected to a rectifying bridge (8) and connected in parallel to ground through a capacitor (9).

The vibrating side of the bridge interconnects with the floating secondary windings (11) of the power transformer (10). The indirect electrical contact between the transducer and the member (4) is provided by grounding the core (12) of the power transformer's secondary coils. Thus the potential between the coils is also equalized.

FIG. 3 illustrates an overhead view of transducers with associated conductive members.

Figure 3C:
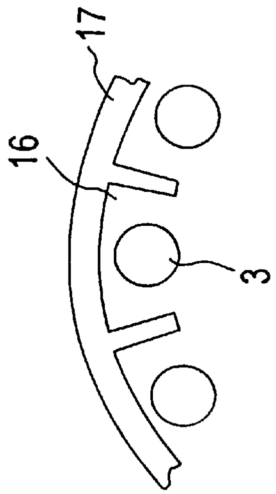
FIG. 3 illustrates an overhead view of transducers with associated conductive members.
Figure 3B:
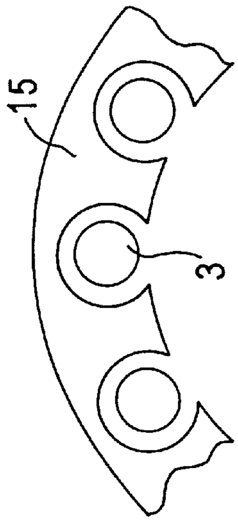
Figure 3A:
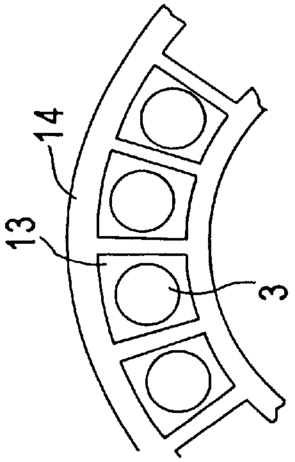

FIG. 3*a* shows an ultrasonic transducer (3) within a quadrilateral isolation territory (13). The quadrilateral isolation territory is topologically bounded by a plate (14) having quadrilateral openings.

FIG. 3*b* shows an ultrasonic transducer within a round isolation territory (15) and this territory has a physical opening through which there is no direct cavitation ion path to another transducer. The isolation territory is topologically bounded by a plate (15) having round shaped openings which intersect one edge of the plate.

FIG. 3*c* shows an ultrasonic transducer (3) within a quadrilateral isolation territory (16). The quadrilateral isolation territory is topologically bounded by a plate (17) having quadrilateral openings which intersect one edge of the plate—through which there is no direct cavitation ion path to another transducer.

Figure 3E:
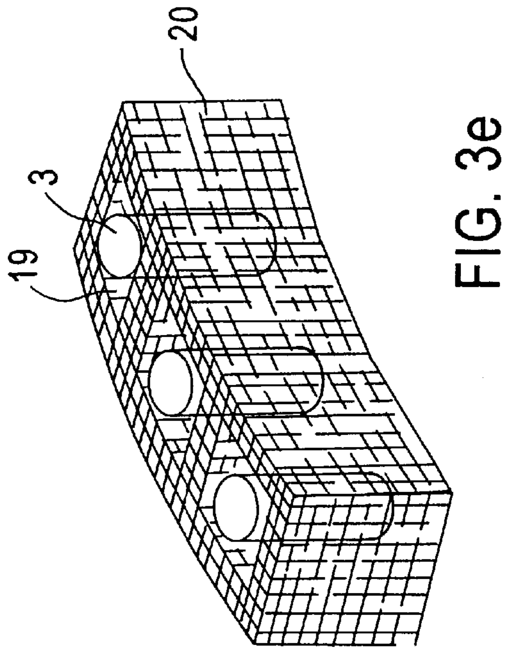
Figure 3D:
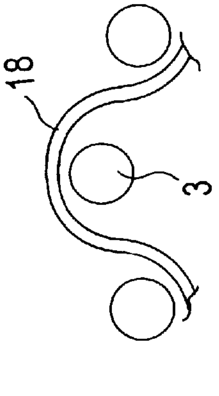

FIG. 3*d* shows an ultrasonic transducer (3) with a wire conductive member (18) which passes partly around the transducer leaving no direct cavitation ion path to another transducer.

FIG. 3*e* shows an ultrasonic transducer (3) within a quadrilateral isolation territory (19). The quadrilateral isolation territory is topologically bounded by a net (20) having quadrilateral openings.

We claim:

1. A method for protecting ultrasonic transducers from deterioration for use in devices having multiple transducers which are immersed in a common liquid reservoir comprising, placing each transducer within an isolation territory within said reservoir and each said territory is topologically bounded by at least one conductive member such that the transducer and its associated member have no direct electrical contact, and ballancing the potential between the members by electrically interconnecting said members, wherein the vibrating surface of each transducer and the centroid of each associated territory are oriented approximately coaxially.

2. A method according to claim 1 wherein the potential between the conductive members is balanced by grounding each said member.

3. A method according to claim 1 wherein indirect electrical contact between the transducers and the conductive members is provided by grounding the core of the secondary coils of the power transformer of the transducers, such that the potential between said coils is equalized.

4. A method according to claim 1 wherein the members are selected from plates, nets, rings, wires, pins, or any combination thereof.

* * * * *